(12) United States Patent
Deppisch et al.

(10) Patent No.: US 6,504,242 B1
(45) Date of Patent: Jan. 7, 2003

(54) ELECTRONIC ASSEMBLY HAVING A WETTING LAYER ON A THERMALLY CONDUCTIVE HEAT SPREADER

(75) Inventors: Carl L. Deppisch, Phoenix, AZ (US); Sabina J. Houle, Phoenix, AZ (US); Thomas J. Fitzgerald, Phoenix, AZ (US); Kristopher E. Dayton, Phoenix, AZ (US); Fay Hua, San Jose, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/990,622

(22) Filed: Nov. 15, 2001

(51) Int. Cl.[7] .......................... H01L 23/10; H01L 23/34
(52) U.S. Cl. ..................... 257/707; 257/714; 257/706
(58) Field of Search .................... 257/706, 707, 257/710, 714, 713, 712

(56) References Cited

U.S. PATENT DOCUMENTS

| | | | |
|---|---|---|---|
| 4,034,469 A | | 7/1977 | Koopman et al. |
| 4,069,498 A | * | 1/1978 | Joshi et al. |
| 4,081,825 A | * | 3/1978 | Koopman et al. |
| 4,092,697 A | * | 5/1978 | Spaight |
| 4,323,914 A | * | 4/1982 | Berndlmaier et al. |
| 4,545,840 A | | 10/1985 | Newman et al. |
| 4,607,277 A | * | 8/1986 | Hassan et al. |
| 4,620,215 A | * | 10/1986 | Lee |
| 5,325,265 A | | 6/1994 | Turlik et al. |
| 5,396,403 A | | 3/1995 | Patel |
| 5,455,457 A | * | 10/1995 | Kurokawa |
| 5,728,606 A | | 3/1998 | Laine et al. |
| 5,783,465 A | | 7/1998 | Canning et al. |
| 5,837,562 A | | 11/1998 | Cho |
| 5,863,814 A | | 1/1999 | Alcoe et al. |
| 5,904,495 A | | 5/1999 | Burke et al. |
| 5,923,086 A | | 7/1999 | Winer et al. |
| 6,022,759 A | | 2/2000 | Seki et al. |
| 6,046,077 A | | 4/2000 | Baba |
| 6,046,498 A | * | 4/2000 | Yoshikawa et al. |
| 6,063,647 A | | 5/2000 | Chen et al. |
| 6,069,025 A | | 5/2000 | Kim |
| 6,111,322 A | * | 8/2000 | Ando et al. |
| 6,121,070 A | | 9/2000 | Akram |
| 6,130,116 A | | 10/2000 | Smith et al. |
| 6,140,144 A | | 10/2000 | Najafi et al. |
| 6,184,066 B1 | | 2/2001 | Chino et al. |
| 6,200,828 B1 | | 3/2001 | Jeng et al. |
| 6,204,091 B1 | | 3/2001 | Smith et al. |
| 6,207,467 B1 | | 3/2001 | Vaiyapuri et al. |
| 6,258,626 B1 | | 7/2001 | Wang et al. |
| 6,261,870 B1 | | 7/2001 | Haehn et al. |
| 6,265,244 B1 | | 7/2001 | Hayashi et al. |
| 6,275,381 B1 | * | 8/2001 | Edwards et al. |
| 6,281,573 B1 | * | 8/2001 | Atwood et al. |

* cited by examiner

*Primary Examiner*—Sheila V. Clark
(74) *Attorney, Agent, or Firm*—Blakely, Sokoloff, Taylor & Zafman LLP

(57) ABSTRACT

An electronic assembly including a die, having an integrated circuit formed therein, a thermally conductive heat spreader, and indium located between the die and the heat spreader, is described. The heat spreader has a layer of nickel. A gold layer is formed on the nickel layer, and provides better wetting of indium than nickel. A better structural connection between the indium and the heat spreader is provided, especially during thermal cycling.

31 Claims, 2 Drawing Sheets

HEAT

COOL

TEST

ELECTRONIC ASSEMBLY HAVING A WETTING LAYER ON A THERMALLY CONDUCTIVE HEAT SPREADER

BACKGROUND OF THE INVENTION

1). Field of the Invention

This invention relates to an electronic assembly of the kind having a semiconductor die which is thermally coupled through an interface material to a thermally conductive heat spreader.

2). Discussion of Related Art

Integrated circuits are manufactured on semiconductor wafers which are subsequently sawed or "diced" into individual dice. Such a die may have solder bump contacts on the integrated circuit. The solder bump contacts are located downward onto contact pads of a package substrate, and attached in a thermal reflow process. Electronic signals can be provided through the solder bump contacts to and from the integrated circuit. Operation of the integrated circuit causes heating thereof. Heat is conducted to an upper surface of the die, and has to be conducted or convected away to maintain the temperature of the integrated circuit below a predetermined level for purposes of maintaining functional integrity of the integrated circuit.

A heat spreader is usually located above the die and thermally coupled to the die by means of a thermal interface material such as thermally conductive grease. The thermally conductive grease transfers minimal stresses from the heat spreader to the die, but has a relatively low thermal conductivity and thus provides a substantial barrier for heat transferring from the die to a heat spreader.

BRIEF DESCRIPTION OF THE DRAWINGS

The invention is described by way of example, with reference to the accompanying drawings, wherein.

DETAILED DESCRIPTION OF THE INVENTION

Figure 1:
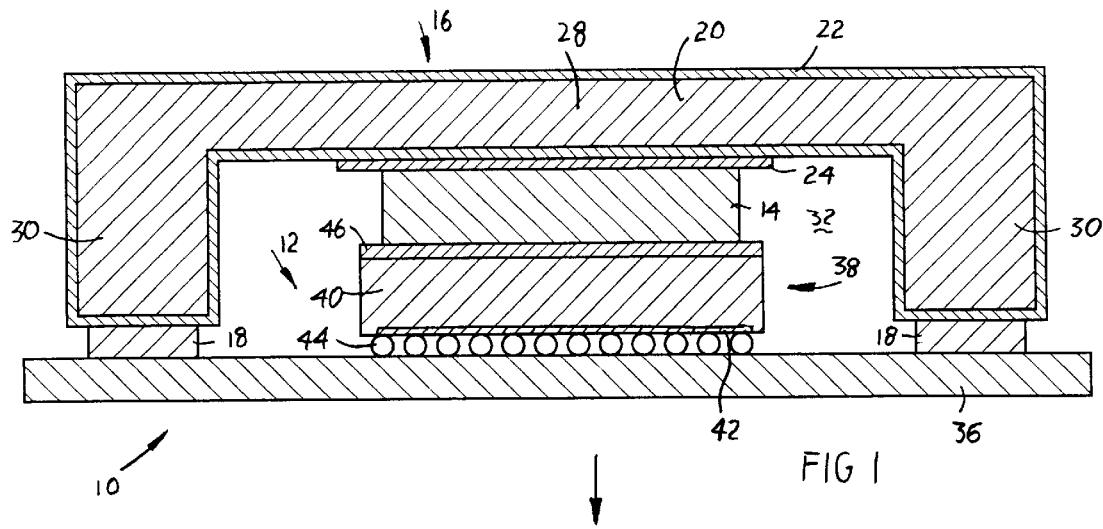
FIG. 1 is a cross-sectional side view of components of an electronic assembly, before being finally assembled.

FIG. 1 of the accompanying drawings illustrates components of an electronic assembly 10, before being finally assembled, including a semiconductor package subassembly 12, a preform of pure indium 14, a heat spreader subassembly 16, and an adhesive 18.

The heat spreader subassembly 16 includes a primary heat spreading structure 20 of copper, a thin nickel layer 22 plated on the primary heat spreading structure 20, and a gold layer 24 plated on the nickel layer 22.

The primary heat spreading structure 20 includes a horizontal heat spreading plate 28, and sides 30 extending downward from edges of the heat spreading plate 28. There are four of the sides 30 which, together with the heat spreading plate 28, form an inverted cap with an internal cavity 32 which is open to the bottom. All surfaces of the primary heat spreading structure 20 are plated with the nickel layer 22. The nickel layer 22 is thus also plated on a lower surface of the heat spreading plate 28.

The gold layer 24 is selectively plated on an area of the nickel layer 22, located on the lower surface of the heat spreading plate 28. The gold layer 24 may be formed by first masking surfaces of the nickel layer 22 where the gold layer 24 is not required, plating on exposed surfaces of the nickel layer 22, and subsequently removing any masking material on surfaces of the nickel layer 22 where the gold layer 24 is prevented from plating. The gold layer 24 has an optimal thickness, which will be discussed hereinbelow.

The semiconductor package subassembly 12 includes a package substrate 36 and a semiconductor die 38. The package substrate 36 is typically primarily made of an organic plastics material. The semiconductor die 38 includes a semiconductor substrate 40 having an integrated circuit 42 of semiconductor electronic components and metal lines in a lower surface thereof.

The semiconductor die 38 further includes solder bumps 44 formed on a lower surface of the integrated circuit 42. The solder bumps 44 are typically formed according to the known controlled collapse chip connect (C4) process. The solder bumps 44 are structurally secured to the semiconductor substrate 40 in a known reflow process. The solder bumps 44 are also electrically connected to the integrated circuit 42, so that signals can be provided through the solder bumps 44 to and from the integrated circuit 42. The semiconductor die 38 also includes a stack 46 of layers formed on an upper surface of the semiconductor substrate 40. The stack 46 includes titanium, a nickel vanadium alloy, and gold layers, which are sequentially deposited on top of one another. The preform of indium 14 is approximately 1 mm thick, has a thermal conductivity of approximately 80 W/mK, and is located on an upper surf ace of the gold layer of the stack 46.

The adhesive 18 is located on lower surfaces of the sides 30. The heat spreader subassembly 16 is located over the semiconductor die 38 and the preform of indium 14. Lower surfaces of the adhesive 18 contact an upper surface of the package substrate 36. A lower surface of the gold layer 24 contacts an upper surface of the preform of indium 14.

A clamp (not shown) is then located over the components of the electronic assembly 10, and the electronic assembly 10, together with the clamp, is sent through a reflow furnace. The components of the electronic assembly 10 are heated in the reflow furnace, and subsequently allowed to cool. The reflow furnace heats the components of the electronic assembly 10 to a temperature of, for example, approximately 170° C. Such a temperature is above a melting temperature of pure indium of approximately 157° C., so that the indium 14 melts.

Figure 2:
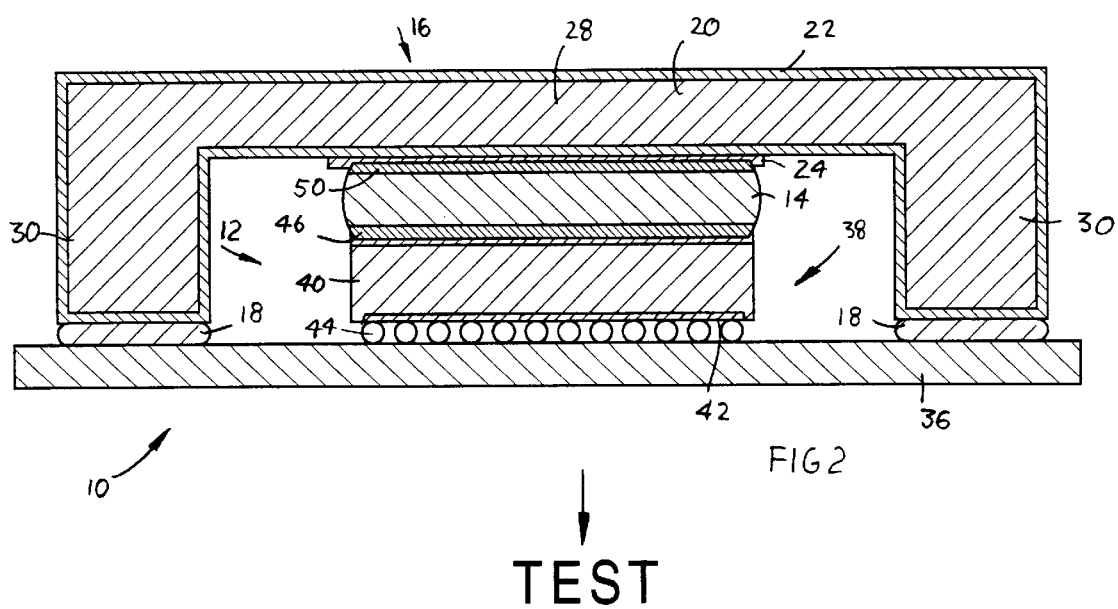
FIG. 2 a view similar to FIG. 1, after final assembly of the components of the electronic assembly.

FIG. 2 illustrates the electronic assembly 10 after it is allowed to cool. Cooling of the indium 14 causes its solidification. By heating and cooling the indium 14, the indium is "soldered" to both the gold layer 24 and the gold layer of the stack 46. The indium 14 thereby forms a layer which secures the stack 46 structurally to the gold layer 24, and which provides a highly effective path for heat to conduct from the stack 46 to the gold layer 24. The sides 30 are also secured to the substrate 36 by the adhesive 18. It should be noted that wetting does not occur because the gold layer is heated to above its melting temperature. Gold has a melting temperature of 1065° C. The gold layer 24 thus promotes wetting although the assembly is heated to 170° C. and the temperature is reversed without going over 170° C.

The purpose of the gold layer 24 is to serve as a wetting layer for the indium 14. Gold is a better wetting layer than nickel, hence the reason why the indium 14 is not located directly against the nickel 22. A better structural and thermal connection is formed by the use of the gold layer 24. The nickel layer 22, for purposes of the present invention, serves to act as a diffusion barrier preventing cross-diffusion between the gold layer 24 and the copper of the primary heat spreading structure 20.

Figure 3:
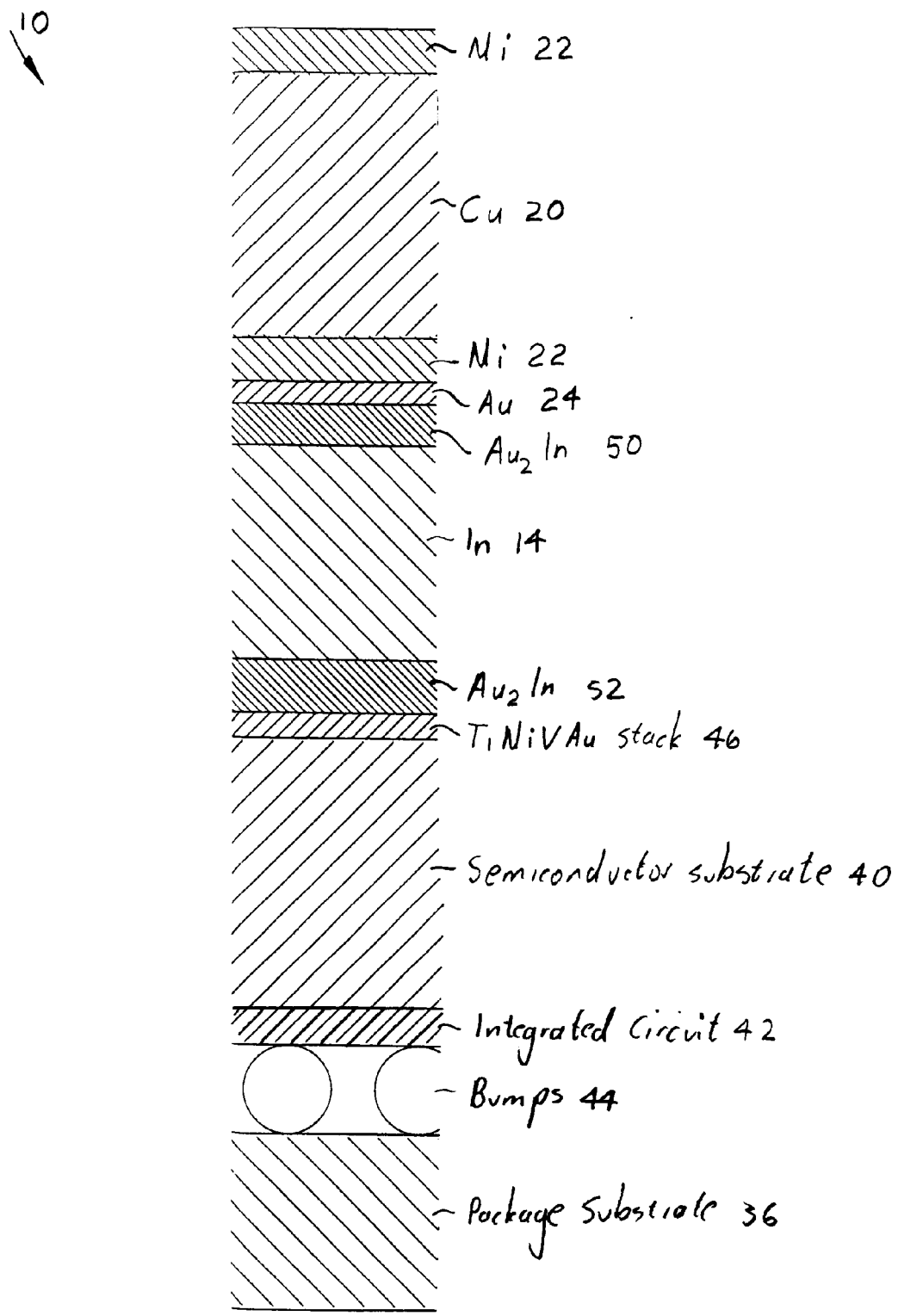
FIG. 3 is a cross-sectional side view illustrating components of the electronic assemble of FIG. 2 in greater detail.

FIG. 3 is a cross-sectional view showing the components of the assembly 10 of FIG. 2 in greater detail. Some of the gold layer 24 and some of the indium 14 are consumed to form an AuIn$_2$ intermetallic layer 50 between the remaining gold layer 24 and the remaining indium 14. An AuIn$_2$ intermetallic is preferred, although other Au—In intermetallics may, and probably do, get formed. A similar AuIn$_2$ intermetallic layer 52 is formed by the gold layer of the stack 46 and the indium 14. The electronic assembly 10 is subsequently alternatingly heated and cooled in a reliability test. It has been found that when the gold layer 24 is approximately three microns thick before being located in the reflow oven, the reliability test allows for 50 cycles of thermal cycling before significant thermal degradation is detected in the tri-layer 46, 14 and 24. If the gold layer 24 is not present, delamination occurs in the first cycle. It was also found that when the gold layer 24 is approximately 0.2 microns thick, cracking only occurs after 200 cycles, often only after 300 cycles. When a thinner gold layer is plated, a thinner intermetallic layer 50 is created than when a thicker gold layer is plated. A thinner intermetallic layer can withstand a larger number of thermal cycles in a given reliability test than a thicker intermetallic layer. Ideally, the gold layer 24 should have substantially no porosity. It has been found that a uniform gold layer as this as 0.02 microns can be formed with substantially no porosity.

The reliability test that was used was as follows:

The temperature was ramped up to 125° C. and held at such temperature for 15 minutes. The temperature was then lowered to −55° C. and held at such temperature for 15 minutes to complete one cycle. The temperature was then again increased to 125° C., the beginning of a second cycle. The remainder of the second cycle was identical to the first cycle, and subsequent cycles were identical to the first cycle.

Referring again to FIG. 2, portions of the gold layer 24 to the left and right of the indium 14 remain unreacted with the indium 14, and thus maintain their thickness as shown in FIG. 1.

Other materials may be used instead of the gold layer 24 to provide a wetting layer over the nickel layer 22. Such materials include tin and noble metals such as silver and palladium, or combinations of these metals. Tin, silver, and palladium have melting temperatures of 232° C., 961° C., and 1552° C. respectively. It was found that silver with a thickness of approximately 0.2 or less microns is optimal. It may also be possible to make the primary heat spreading structure 20 of other materials such as aluminum, and have nickel plated on the aluminum. Materials other than the pure indium 14 may also be possible, but such a material preferably has a thermal conductivity of at least 35 W/mK, although a thermal conductivity of at least 70 W/mK is much preferred.

In use, electronic signals are transmitted through the solder bumps 44 between the package substrate 36 and the integrated circuit 42. Operation of the integrated circuit 42 causes heating of the semiconductor die 38. Heat transfers from the semiconductor die 38 through the indium 14 to the heat spreader subassembly 16. The heat spreads sideways through the heat spreader subassembly 16 and is conducted or convected from an upper surface of the heat spreader subassembly 16.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A method of constructing an electronic assembly, comprising:

forming a wetting layer of a material other than nickel on a surface of a thermally conductive heat spreader, the wetting layer being between 0.02 and 3.0 microns thick;

locating a metal thermal interface material, of a different material than the wetting layer, against a surface of the wetting layer;

locating a die having an integrated circuit formed therein against the thermal interface material;

heating the metal thermal interface material so that it melts, the material of the wetting layer promoting wetting of the metal thermal interface material over the thermally conductive heat spreader; and allowing the metal thermal interface material to cool so that it solidifies and forms a thermal and structural couple between the die and the thermally conductive heat spreader.

2. The method of claim 1, wherein the material of the wetting layer includes at least one of gold, silver, palladium, and tin.

3. The method of claim 1, wherein the material of the wetting layer is gold.

4. The method of claim 1, wherein the wetting layer is approximately 0.2 microns thick.

5. The method of claim 1, wherein the metal thermal interface material includes indium.

6. The method of claim 1, wherein the metal thermal interface material is heated and allowed to cool before reaching a melting temperature of the wetting layer.

7. An electronic assembly, comprising:

a thermally conductive heat spreader;

a wetting layer of a material other than nickel formed on a lower surface of the thermally conductive heat spreader, the wetting layer being between 0.02 and 3.0 microns thick;

a die having an integrated circuit formed therein; and a metal thermal interface material of a different material than the wetting layer located on the die with a lower surface of the wetting layer on an upper surface of the metal thermal interface material, the metal thermal interface material having been heated so that it melted, and allowed to cool so that it solidified and formed a thermal and structural interface between the die and the thermally conductive heat spreader.

8. The electronic assembly of claim 8, wherein the material of the wetting layer is gold.

9. The electronic assembly of claim 1, wherein the wetting layer is approximately 0.2 microns thick before the metal thermal interface material is melted.

10. The electronic assembly of claim 7, wherein a portion of the wetting layer is not located between the die and the thermally conductive heat spreader.

11. The electronic assembly of claim 10, wherein the portion is gold, having a thickness of between 0.02 and 3.0 microns.

12. The electronic assembly of claim 7, wherein the wetting layer is selected of a material and thickness so that the assembly can be cycled between 125° C. and −55° C. at least 40 times without substantial damage to an interface between the heat spreader and the interface material.

13. The electronic assembly of claim 7, wherein the metal thermal interface material has a thermal conductivity of at least 35 W/mK.

14. The electronic assembly of claim 13, wherein the metal thermal interface material has a thermal conductivity of at least 70 W/mK.

15. The electronic assembly of claim 7, wherein the metal thermal interface material includes indium.

16. The electronic assembly of claim 7, wherein the thermally conductive heat spreader includes a primary heat spreading structure and a diffusion barrier layer on the primary heat spreading structure, the diffusion barrier layer being located between the wetting layer and the primary heat spreading structure and being made of a material which prevents diffusion of the material of the wetting layer therethrough to the primary heat spreading structure.

17. The electronic assembly of claim 16, wherein the primary heat spreading structure is made of copper.

18. The electronic assembly of claim 16, wherein the diffusion barrier layer is made of nickel.

19. The electronic assembly of claim 7, further comprising:
a substrate, the die being mounted on an upper surface of the substrate.

20. An electronic assembly, comprising: a substrate;
a die having an integrated circuit formed in a lower surface thereof, mounted on an upper surface of the substrate;
a thermally conductive heat spreader, including a primary heat spreading structure and a nickel diffusion barrier layer formed on a lower surface of the primary heat spreading structure;
a wetting layer formed on a lower surface of the diffusion barrier layer, the wetting layer being of a material other than nickel; and
an indium thermal interface material other than the wetting layer located on the die with a lower surface of the wetting layer on an upper surface of the indium thermal interface material, the indium thermal interface material having been heated so that it melted and allowed to cool so that it solidified, and formed a thermal and structural interface between the die and the diffusion barrier of the thermally conductive heat spreader.

21. The electronic assembly of claim 20, wherein the material of the wetting layer is at least one of gold, silver, and tin.

22. The electronic assembly of claim 20, wherein the material of the wetting layer is gold.

23. The electronic assembly of claim 22, wherein the wetting layer is between 0.02 and 3.0 microns thick.

24. The electronic assembly of claim 20, wherein the wetting layer is selected of a material and thickness so that the assembly can be cycled between 125° C. and −55° C. at least 40 times without substantial damage to an interface between the heat spreader and the interface material.

25. A method of constructing an electronic assembly, comprising:
locating a die, a metal thermal interface material, a wetting layer of between 0.02 and 3.0 microns thick of a material other than nickel, and a thermally conductive heat spreader in sequence next to one another;
heating the metal thermal interface material so that it melts, the material of the wetting layer promoting wetting of the metal thermal interface material over the thermally conductive heat spreader; and
allowing the metal thermal interface material to cool so that it solidifies and forms a thermal and structural couple between the die and the thermally conductive heat spreader.

26. The method of claim 25, wherein the material of the wetting layer includes at least one of gold, silver, palladium, and tin.

27. The method of claim 25, wherein the metal thermal interface material includes indium.

28. A method of constructing an electronic assembly, comprising:
forming a wetting layer of a material other than nickel on a surface of a thermally conductive heat spreader;
locating a metal thermal interface material, of a different material than the wetting layer, against a surface of the wetting layer;
locating a die having an integrated circuit formed therein against the thermal interface material;
heating the metal thermal interface material so that it melts, the material of the wetting layer promoting wetting of the metal thermal interface material over the thermally conductive heat spreader; and
allowing the metal thermal interface material to cool so that it solidifies and forms a thermal and structural couple between the die and the thermally conductive heat spreader, wherein the metal thermal interface material is heated and allowed to cool before reaching a melting temperature of the wetting layer.

29. An electronic assembly, comprising:
a thermally conductive heat spreader;
a wetting layer of a material other than nickel formed on a lower surface of the thermally conductive heat spreader;
a die having an integrated circuit formed therein; and
a metal thermal interface material, of a different material than the wetting layer, located on the die with a lower surface of the wetting layer on an upper surface of the metal thermal interface material, the metal thermal interface material having been heated so that it melted, and allowed to cool so that it solidified and formed a thermal and structural interface between the die and the thermally conductive heat spreader, wherein the wetting layer is selected of a material and thickness so that the assembly can be cycled between 125° C. and −55° C. at least 40 times without substantial damage to an interface between the heat spreader and the interface material.

30. An electronic assembly, comprising:
a thermally conductive heat spreader;
a wetting layer of a material other than nickel formed on a lower surface of the thermally conductive heat spreader;
a die having an integrated circuit formed therein; and
a metal thermal interface material, of a different material than the wetting layer, located on the die with a lower surface of the wetting layer on an upper surface of the metal thermal interface material, the metal thermal interface material having been heated so that it melted, and allowed to cool so that it solidified and formed a thermal and structural interface between the die and the thermally conductive heat spreader, wherein the metal thermal interface material has a thermal conductivity of at least 35 W/mK.

31. An electronic assembly, comprising:
a thermally conductive heat spreader;
a wetting layer of a material other than nickel formed on a lower surface of the thermally conductive heat spreader, wherein the thermally conductive heat spreader includes a primary heat spreading structure and a diffusion barrier layer on the primary heat spreading structure, the diffusion barrier layer being located between the wetting layer and the primary heat spreading structure and being made of a material which prevents diffusion of the material of the wetting layer therethrough to the primary heat spreading structure;
a die having an integrated circuit formed therein; and
a metal thermal interface material of a different material than the wetting layer located on the die with a lower surface of the wetting layer on an upper surface of the metal thermal interface material, the metal thermal interface material having been heated so that it melted, and allowed to cool so that it solidified and formed a thermal and structural interface between the die and the thermally conductive heat spreader.

* * * * *